(12) United States Patent
Noguchi

(10) Patent No.: US 6,977,851 B2
(45) Date of Patent: Dec. 20, 2005

(54) SEMICONDUCTOR MEMORY DEVICE

(75) Inventor: Hidekazu Noguchi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/876,668

(22) Filed: Jun. 28, 2004

(65) Prior Publication Data

US 2005/0047225 A1 Mar. 3, 2005

(30) Foreign Application Priority Data

Aug. 27, 2003 (JP) ............................. 2003-209149

(51) Int. Cl.$^7$ ................................................ G11C 7/00
(52) U.S. Cl. .................................. 365/200; 365/225.7
(58) Field of Search ............................. 365/200, 225.7

(56) References Cited

U.S. PATENT DOCUMENTS

| | | | |
|---|---|---|---|
| 6,434,064 B2 | 8/2002 | Nagai | |
| 6,542,420 B2 * | 4/2003 | Takase | 365/200 |
| 6,704,228 B2 * | 3/2004 | Jang et al. | 365/200 |
| 6,707,730 B2 * | 3/2004 | Mori et al. | 364/200 |
| 6,728,158 B2 * | 4/2004 | Takahashi et al. | 365/225.7 |

FOREIGN PATENT DOCUMENTS

| | | |
|---|---|---|
| JP | 07-211779 | 8/1995 |
| JP | 7-211779 | 8/1995 |
| JP | 2002-15593 | 1/2002 |

* cited by examiner

Primary Examiner—Michael Tran
(74) Attorney, Agent, or Firm—Nixon Peabody LLP; Donald R. Studebaker

(57) ABSTRACT

A semiconductor memory device has a redundant memory cell array having redundant memory cells arranged in redundant rows and columns and has first and second fuse blocks. The first fuse block has first fuses for corresponding to an address of a row address signal. The second fuse block has second fuses for corresponding to a column address signal. The first fuse block stores an address of a defective row of the memory cell and the second fuse block stores an address of a defective column of the memory cell. Furthermore, the semiconductor memory device has an address matching detector connected with the first and second fuses. The address matching detector checks consistency of the address of the row or column address signal with the address of the defective row or column.

43 Claims, 10 Drawing Sheets

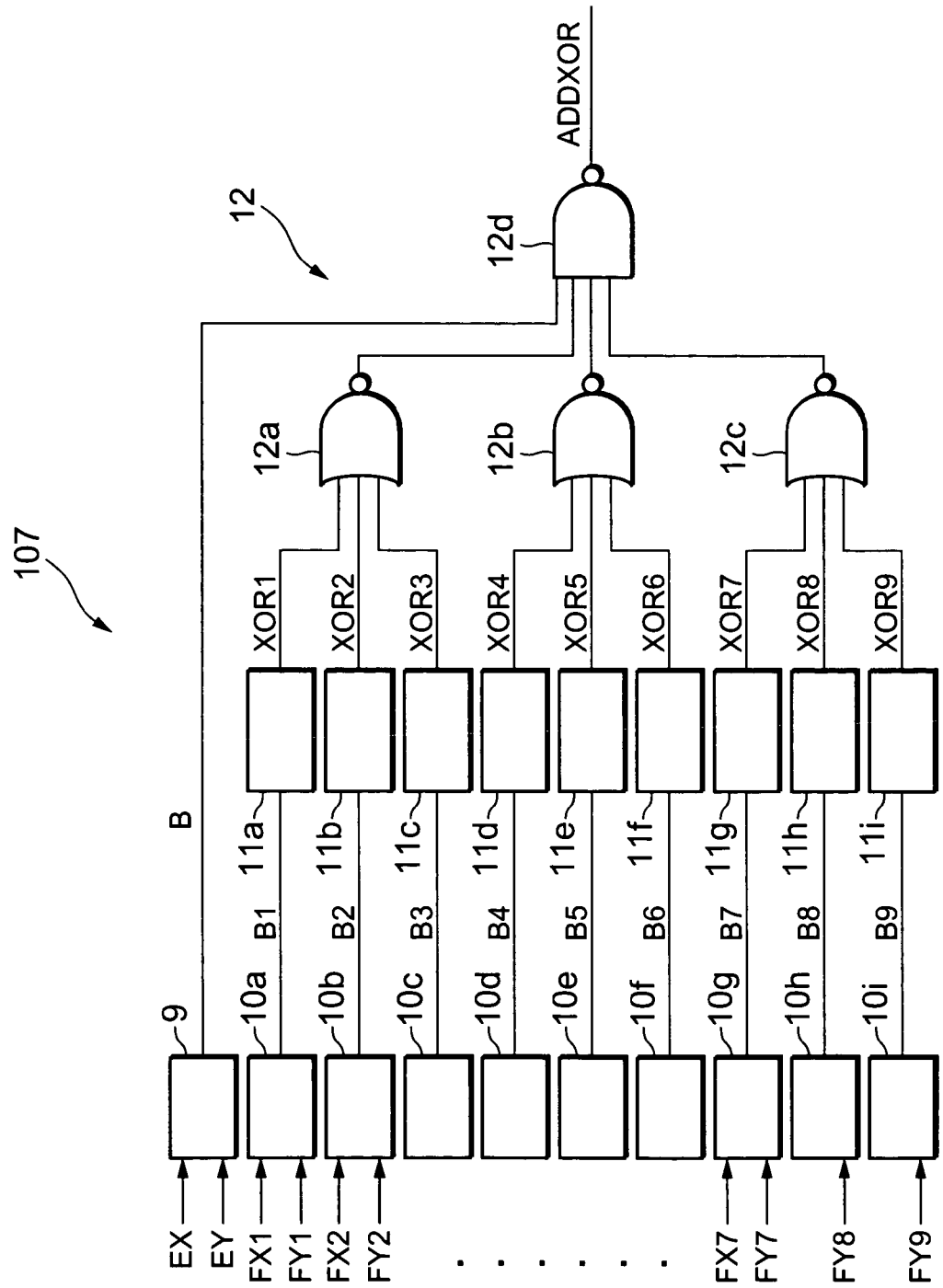

SEMICONDUCTOR MEMORY DEVICE

BACKGROUND OF THE INVENTION

1. Field of the Invention

The present invention relates to a semiconductor memory device, in particular, including a redundant memory cell substitution circuit which selects a redundant memory cell instead of a defective memory cell. This is a counterpart of and claims priority to Japanese Patent Application No. 2003-209149 filed on Aug. 27, 2003, which is herein incorporated by reference.

2. Description of the Related Art

In the related art, a semiconductor memory device has a memory cell array consisting of a plurality of the memory cell blocks arranged in matrix. Each of the memory cell blocks includes a plurality of memory cells arranged in matrix. A redundant memory cell array consisting of a plurality of redundant memory cells is disposed in each of the memory cell blocks. The redundant memory cell is used instead of a defective memory cell. The redundant memory cell array has an array in a row direction and an array in a column direction, and the redundant memory cell is selected instead of the defective memory cell in each of the row and column directions. It is necessary to use a redundant memory cell substitution circuit that comprises a fuse block and an address matching detector. The fuse block has information with respect to an address of the defective memory cell for which the redundant memory cell is substituted. The address matching detector checks whether an external address signal input in the semiconductor memory device corresponds to the address of the defective memory cell or not, in order to select the redundant memory cell instead of the defective memory cell. However, recently, the semiconductor integrated circuit is made finer, and on the other hand, the number of the redundant memory cell array is increasing in the semiconductor memory device for the purpose of improving the process yield of the semiconductor memory device. Therefore, the proportion of the redundant memory cell substitution circuit to the memory cell array in the area of the semiconductor integrated circuit is increasing, and there is room for improvement of the miniaturization in the semiconductor device. To decrease the above-mentioned proportion of the redundant memory cell substitution circuit, the invention of the semiconductor memory device has been proposed as described in Documents 1 (Japanese Patent Publication Laid-Open No. Hei 14(2002)-015593) and Document 2 (Japanese Patent Publication Laid-Open No. Hei 07(1995)-211779).

In the semiconductor memory device as described in the Document 1 (in particular, Pages 8–9 and FIG. 3), one fuse block is formed so as to access to a redundant memory cell instead of a defective memory cell in either the row direction or the column direction. As the result, the amount of fuses can be decreased, and the area covered with the fuses can be decreased.

In the semiconductor memory device as described in the Document 2 (in particular, Pages 4–6 and FIGS. 1 and 2), the leakage current is prevented by P-type wells which is made smaller in the surface of the N-type well formed in the forming step of the P-type MOS (Metal Oxide Semiconductor) transistor. That is, the intervals between a plurality of the arranged fuses is decreased by forming the smaller P-type wells which can prevent the leakage current with every fuse. Therefore, the area in which the fuses are disposed can be decreased.

However, in the above-mentioned semiconductor memory device as described in Document 1, though the fuse block can be used to have access to the redundant memory cell instead of the defective memory cell in both the row direction and the column direction, the address matching detectors are needed as much as the number of the fuse blocks. That is, in the device in the Document 1, it is necessary that the area of the redundant memory cell substitution circuit is further decreased. Also, in the above-mentioned semiconductor memory device as described in the Document 2, though the area in which the fuses are disposed is decreased by decrease the intervals between a plurality of the arranged fuses, it is not disclosed that the area of the address matching detectors is decreased. Therefore, it is necessary that the area of the redundant memory cell substitution circuit is further decreased in the device in the Document 2, too.

SUMMARY OF THE INVENTION

An object of the present invention is to decrease the area of the redundant memory cell substitution circuit and to miniaturize the semiconductor memory device.

According to an aspect of the present invention, for achieving the above object, there is provided a semiconductor memory device comprising: a memory cell block having a plurality of memory cells arranged in a plurality of rows and in a plurality of columns, wherein one of the rows is selected by a row address signal, and wherein one of the columns is selected by a column address signal; a redundant memory cell array having a plurality of redundant memory cells arranged in a plurality of redundant rows and in a plurality of redundant columns; a first fuse block having a plurality of first fuses, the first fuses corresponding to an address of the row address signal, wherein the first fuse block stores an address of a defective row of the memory cell block; a second fuse block having a plurality of second fuses, the second fuses corresponding to an address of the column address signal, wherein the second fuse block stores an address of a defective column of the memory cell block; and an address matching detector which is connected with both the first fuses and the second fuses, wherein the address matching detector checks consistency of the address of the row address signal with the address of the defective row stored in the first fuse block.

According to another aspect of the present invention, for achieving the above object, there is provided a semiconductor memory device comprising: a memory cell block having a plurality of memory cells arranged in a plurality of rows and in a plurality of columns, wherein one of the rows is selected by a row address signal, and wherein one of the columns is selected by a column address signal; a redundant memory cell array having a plurality of redundant memory cells arranged in a plurality of redundant rows and in a plurality of redundant columns; a first fuse block having a plurality of first fuses, the first fuses corresponding to an address of the row address signal, wherein the first fuse block stores an address of a defective row of the memory cell block; a second fuse block having a plurality of second fuses, the second fuses corresponding to an address of the column address signal, wherein the second fuse block stores an address of a defective column of the memory cell block; and an address matching detector which is connected with both the first fuses and the second fuses, wherein the address matching detector checks consistency of the address of the column address signal with the address of the defective column stored in the second fuse block.

According to the other aspect of the present invention, for achieving the above object, there is provided a semiconductor memory device comprising: a memory cell block having a plurality of memory cells arranged in a plurality of rows and in a plurality of columns, wherein one of the rows is selected by a row address signal and one of the columns is selected by a column address signal; a redundant memory cell array having a plurality of redundant memory cells arranged in a plurality of redundant rows and in a plurality of redundant columns; a row fuse block having a plurality of row address storing fuses, the row fuse block corresponding to an address of the row address signal, wherein the row fuse block stores an address of a defective row of the memory cell block, based on connection states of the row address storing fuses; a column fuse block having a plurality of column address storing fuses, the column fuse block corresponding to an address of the column address signal, wherein the column fuse block stores an address of a defective column of the memory cell block, based on connection states of the column address storing fuses; a plurality of selecting circuits, each of which is connected with both the row address storing fuses and the column address storing fuses, wherein the selecting circuits output a plurality of state signals which represent one of the connection states of the row address storing fuses and the column address storing fuses; a first logic circuit connected with the selecting circuits, wherein the first logic circuit compares one of the addresses of the row address signal and the column address signal with the state signals; and a second logic circuit connected with the first logic circuit, wherein the second logic circuit detects one of consistency of the address of the row address signal with the address of the defective row and consistency of the address of the column address signal with the address of the defective column.

The above and further objects and novel features of the invention will more fully appear from the following detailed description, appended claims and the accompanying drawings.

BRIEF DESCRIPTION OF THE DRAWINGS

FIG. 3 is a block diagram of the address matching detector 107 according to the first preferred embodiment.

DETAILED DESCRIPTION OF THE PREFERRED EMBODIMENTS

The present invention will be described hereinafter with references to the accompanying drawings. The drawings used for this description typically illustrate major characteristic parts in order that the present invention will be easily understood.

First Preferred Embodiment

Figure 1A:
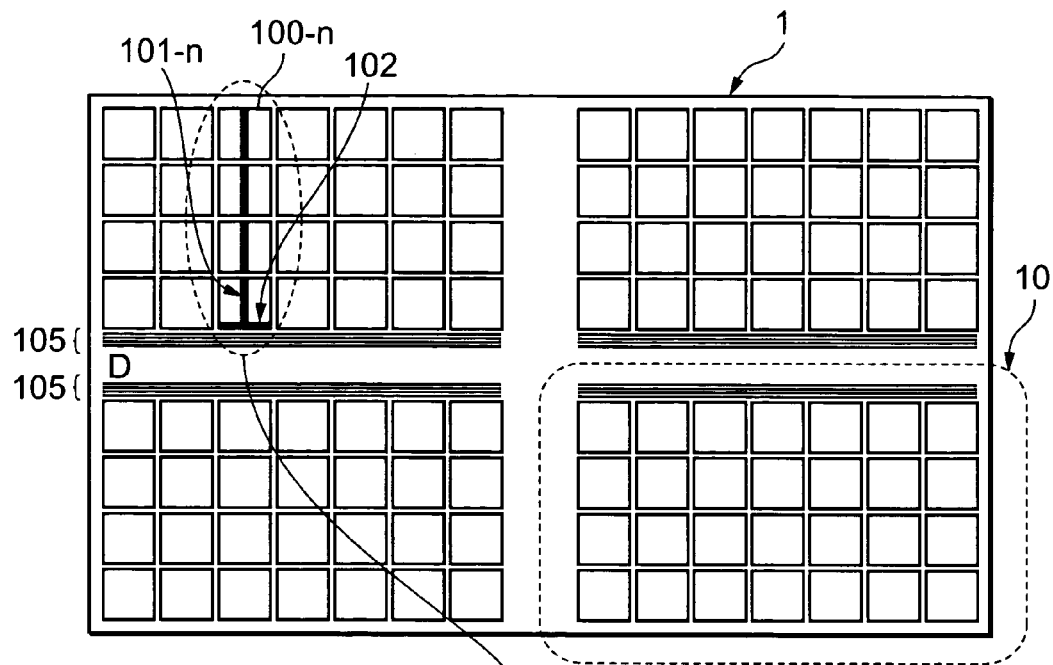
FIG. 1 including FIG. 1A
FIG. 1B is a plain view describing a semiconductor memory chip according to a first preferred embodiment.

FIG. 1A is a plain view describing a semiconductor memory chip according to a first preferred embodiment of the present invention. On a surface of the semiconductor memory chip 1, there are four memory cell arrays 10. Each of the memory cell arrays 10 includes a plurality of memory cell blocks 100-n arranged lengthwise and crosswise. The four memory cell arrays 10 are spaced away from one another through the dividing region D. The memory cell block 100-n has a plurality of memory cells arranged in row and column directions.

Figure 1B:
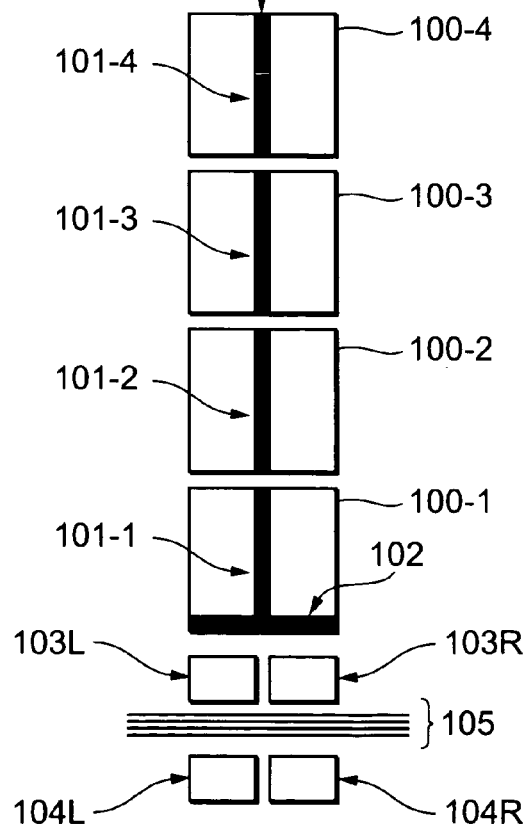

FIG. 1B is an enlarged view at the elliptic portion of the semiconductor memory chip in FIG. 1A. As shown in FIG. 1B, for example, each of the memory cell blocks 100-n has a row redundant memory cell array 101-n. The memory cell block 100-1 located next to a plurality of address signal lines 105 has a column redundant memory cell array 102. The row redundant memory cell array 101-n is formed at a central region of each of the memory cell blocks 100-n so that the row redundant memory cell array 101-n substantially equally can divide the memory cell block 100-n. The column redundant memory cell array 102 is formed at an end portion of each of the memory cell blocks 100-n. The row redundant memory cell array 101-n has a plurality of redundant memory cells arranged in a plurality of redundant rows, and the redundant rows are parallel to the row direction in which the memory cells are arranged. Likewise, the column redundant memory cell array 102 has a plurality of redundant memory cells arranged in a plurality of redundant columns, and the redundant columns are parallel to the column direction in which the memory cells are arranged. One of the redundant rows in the row redundant memory cell array 101-n is selected instead of a defective row of the memory cell block 100-n. Likewise, one of the redundant columns in the column redundant memory cell array 102 is selected instead of a defective column of the memory cell block 100-n.

A plurality of address signal lines 105 are formed along the memory cell array 10 and in the dividing region D. Two row fuse blocks 103L and 103R are disposed between the memory cell block 100-1 and the address signal lines 105. Two column fuse blocks 104L and 104R are disposed across the address signal lines 105 from the row fuse blocks 103L and 103R. The row fuse blocks 103L and 103R and the column fuse blocks 104L and 104R have a plurality of fuses made of polycrystalline silicon or metallic material. The fuses of the row fuse block 103L corresponds to row addresses of the memory cells arranged at the left sides of the four memory cell blocks 100-1–100-4. Likewise, the fuses of the row fuse block 103R corresponds to row addresses of the memory cells arranged at the right sides of the four memory cell blocks 100-1–100-4. The fuses of the column fuse block 104L corresponds to column addresses of the memory cells arranged at the left sides of the four memory cell blocks 100-1–100-4. Likewise, the fuses of the column fuse block 104R corresponds to column addresses of the memory cells arranged at the right sides of the four memory cell blocks 100-1–100-4. That is, the fuses of one row fuse block corresponds to row addresses of either left sides or right sides of a plurality of memory cell blocks 100-n arranged in a queue in a direction perpendicular to the address signal lines 105 in a memory cell array 10. The fuses of one column fuse block corresponds to column addresses of either left sides or right sides of a plurality of memory cell blocks 100-n arranged in a queue in a direction perpendicular to the address signal lines 105 in a memory cell array 10.

Figure 2A:
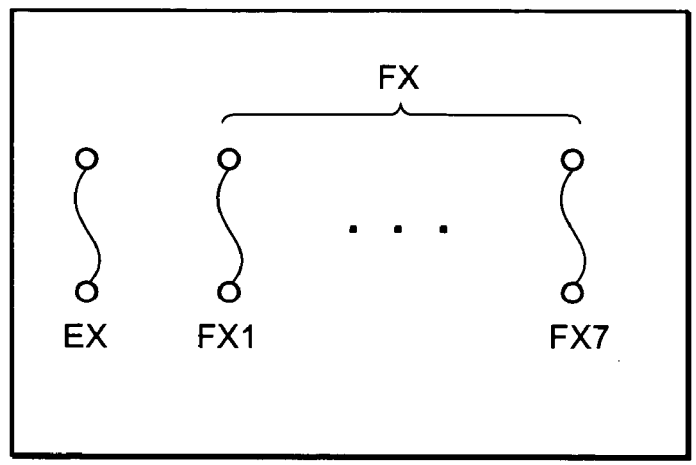
FIG. 2 including FIG. 2A
FIG. 2B is a schematic diagram of the row fuse block in FIG. 1B.
Figure 2B:
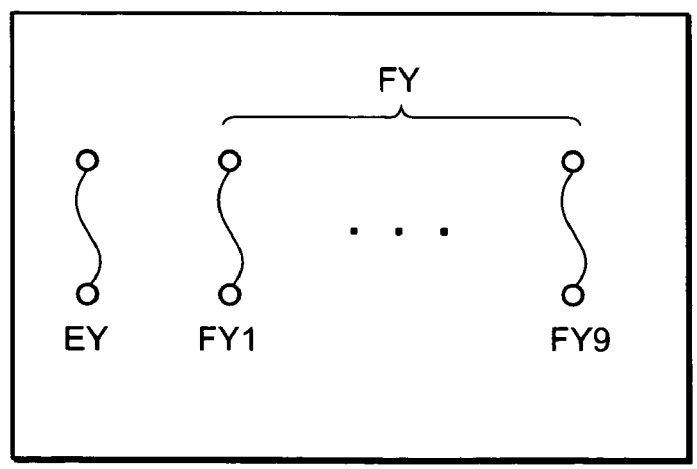

FIG. 2A is a schematic drawing of the row fuse block in FIG. 1B. FIG. 2B is a schematic drawing of the column fuse block in FIG. 1B. For example, as shown in FIG. 2A, the row fuse block 103L or 103R has one row redundancy enable fuse EX and seven row address storing fuses FX1–FX7. Information based on an address of the defective row or the defective column is preliminarily stored in the row fuse block 103L or 103R by disconnecting at least one of the row address storing fuses FX1–FX7. Also, for example, as shown in FIG. 2B, the column fuse block 104L or 104R has one column redundancy enable fuse EY and nine column address storing fuses FY1–FY9. Information based on a column address of the defective memory cell is preliminarily stored in the column fuse block 104L or 104R by disconnecting at least one of the column address storing fuses FY1–FY9. An external address signal input from the outside of the semiconductor memory device is transmitted in the address signal lines 105. The external address signal is either an external row address signal or an external column address signal. In this instance, for example, the address signal lines 105 transmits either the row address signal which consists of 7 bits A1–A7 or the column address signal which consists of 9 bits A1–A9. An address matching detector 107 (not shown in FIGS. 1A and 1B) is disposed under the layer on which the address signal lines 105 are formed and is connected with both the row fuse block 103L or 103R and the column fuse block 104L or 104R.

FIG. 3 is a block diagram of the address matching detector 107 according to the first preferred embodiment. As shown in FIG. 3, the address matching detector 107 comprises selecting circuits 9 and 10a–10i, a first logic circuit 11 which includes exclusive OR circuits 11a–11i and a second logic circuit 12 which includes NOR circuits 12a–12c and a NAND circuit 12d.

The selecting circuit 9 has the row redundancy enable fuse EX and the column redundancy enable fuse EY and outputs a state signal B which indicates a connection state with respect to either the row redundancy enable fuse EX or the column redundancy enable fuse EY. That is, the state signal B represents whether the fuse EX or EY is connected or not. The selecting circuit 9 outputs the state signal B indicating "1" when a redundant row in the row redundant memory cell array 101-n is selected instead of a defective row of the memory cell block 100-n or when a redundant column in the column redundant memory cell array 102 is selected instead of a defective column of the memory cell block 100-n. Also, The selecting circuit 9 outputs the state signal B indicating "0" when the redundant row and the redundant column are not selected.

The selecting circuits 10a–10g have the row address storing fuse FX1–FX7 and the column address storing fuse FY1–FY7 respectively. The selecting circuits 10a–10g output the state signals B1–B7 respectively. The state signals B1–B7 represent connection states with respect to the row address storing fuses FX1–FX7, that is, whether the fuses FX1–FX7 are connected or not, when the selecting circuits 10a–10g check whether an address of the external row address signal corresponds to an address of the defective row of the memory cell block 100-n or not. On the other hand, when the selecting circuits 10a–10g check whether an address of the external column address signal corresponds to an address of the defective column of the memory cell block 100-n or not, the state signals B1–B7 represent connection states with respect to the column address storing fuses FY1–FY7, that is, whether the fuses FY1–FY7 are connected or not.

The selecting circuits 10h and 10i have the column address storing fuses FY8 and FY9 respectively and output the state signals B8 and B9 respectively. The state signals B8 and B9 represent connection states with respect to the column address storing fuses FY8 and FY9, that is, whether the fuses FY8 and FY9 are connected or not. On the other hand, the state signals B8 and B9 represent "0" when the selecting circuits 10a–10g check whether the address of the external row address signal corresponds to the address of the defective row of the memory cell block 100-n or not.

The exclusive OR circuits 11a–11i of the first logic circuit 11 compares the address of the external row address signal or the external column address signal with the state signals B1–B9, and output exclusive OR signals XOR1–XOR9.

The NOR circuits 12a–12c and the NAND circuit 12d of the second logic circuit 12 detect consistency of the address of the external row address signal with the address of the defective row in the memory cell block 100-n. The redundant row of the redundant memory cell array is selected if the address of the external row address signal corresponds to the state signals B1–B9. Also, the NOR circuits 12a–12c and the NAND circuit 12d detect consistency of the address of the external column address signal with the address of the defective column in the memory cell block 100-n. The redundant column of the redundant memory cell array is selected if the address of the external column address signal corresponds to the state signals B1–B9. The second logic circuit 12 receives the exclusive OR signals XOR1–XOR9 output from the first logic circuit 11 and the state signal B output from the selecting circuit 9. The second logic circuit 12 outputs an OR signal ADDXOR based on the exclusive OR signals XOR1–XOR9 and the state signal B.

Details of the configurations and the operations with respect to the above-mentioned circuits are described below.

Figure 4:
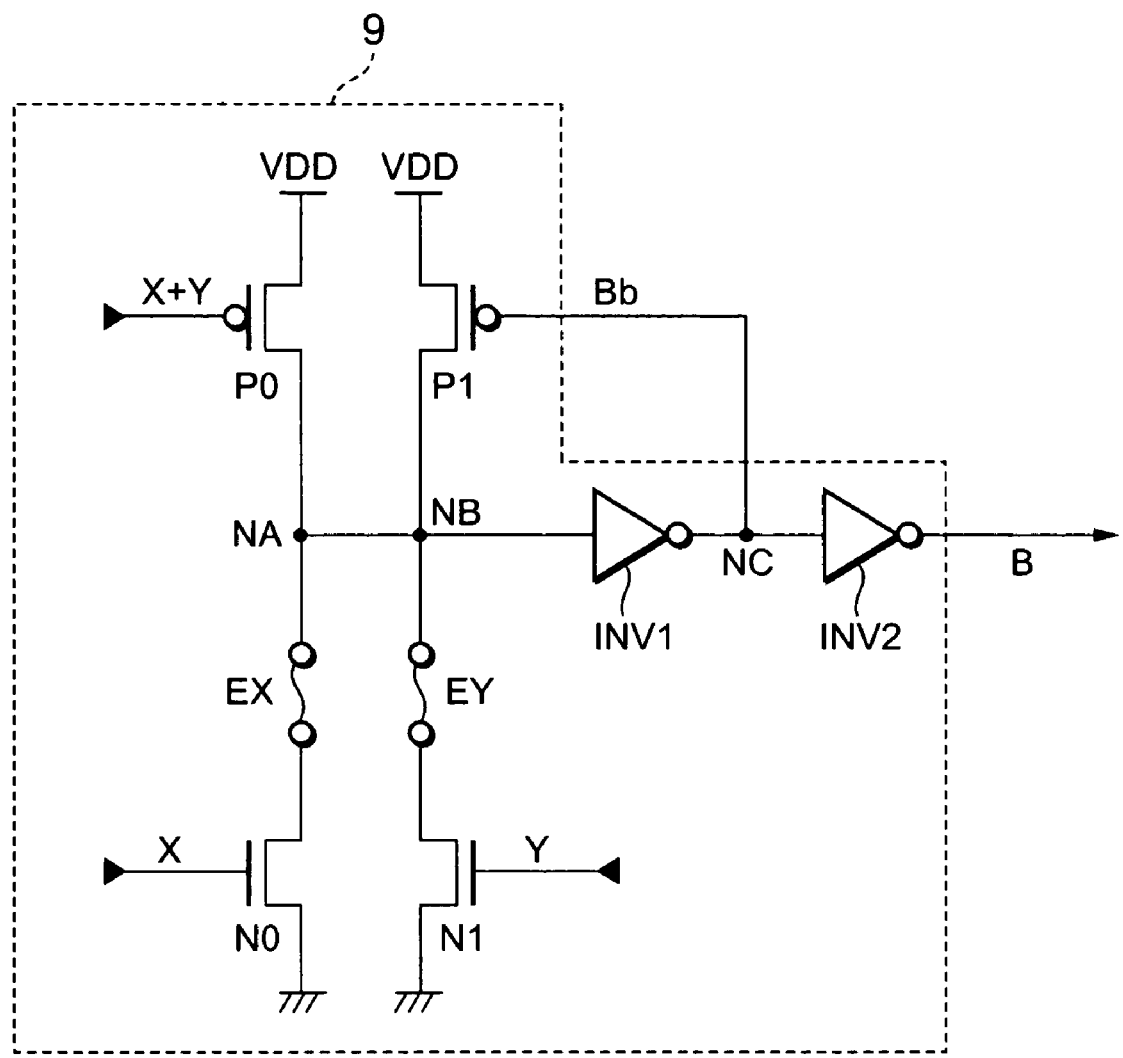
FIG. 4 is a circuit layout showing a detailed configuration of the selecting circuit 9 in the address matching detector 107 shown in FIG. 3.

FIG. 4 is a circuit layout showing a detailed configuration of the selecting circuit 9 in the address matching detector 107 shown in FIG. 3. The selecting circuit 9 comprises the row redundancy enable fuses EX, the column redundancy enable fuse EY, P-type MOS (hereinafter referred to as the "PMOS") transistors P0 and P1, N-type MOS (hereinafter referred to as the "NMOS") transistors N0 and N1 and inverters INV1 and INV2. The PMOS transistor P0 is connected between a power supply potential VDD and a node NA. The fuse EX and the NMOS transistor N0 are connected in series between the node NA and a ground potential VSS. Also, the PMOS transistor P1 is connected between the power supply potential VDD and a node NB. The fuse EY and the NMOS transistor N1 are connected in series between the node NB and the ground potential VSS. The node NA and the node NB are electrically connected to each other. The inverter INV1 is connected between nodes NC and NB so that the potentials on the nodes NA and NB, that is, the state signal B which represents the connection state with respect to either the fuse EX or the fuse EY, is input to the inverter INV1. The inverter INV1 is connected with end portions which change to higher potential of the fuses EX and EY. The inverter INV2 is connected to the node NC so that the output signal from the inverter INV1, that is, an inverted state signal Bb which is generated by inverting the state signal B, is input to the inverter INV2. The inverter INV2 outputs an inverted signal which is generated by inverting the inverted state signal Bb, that is, the state signal B, to the first logic circuit 11. The conduction state in the NMOS transistor N0 is controlled by a row select signal X input to the gate electrode of the NMOS transistor N0. The conduction state the NMOS transistor N1 is controlled by a column select signal Y input to the gate electrode of the NMOS transistor N1. Also, the row select signal X and the column select signal Y are used to select the memory cell in the memory cell block 100-*n*.

The operation of the selecting circuit 9 is described below. In the standby mode of the address matching detector 107, both the row select signal X and the column select signal Y are non-active, that is, the both signals X and Y indicate "0". In this case, an OR signal X+Y which is generated based on the row select signal X and the column select signal Y turns to "0", the PMOS transistor P0 is turned ON. Therefore, the nodes NA and NB are charged with the power supply voltage by the power supply potential VDD.

When the address matching detector 107 checks whether the redundancy is executed or not, the row select signal X and the column select signal Y turn active alternatively. The conduction state in the PMOS transistor P0 is controlled by the OR signal X+Y based on the row select signal X and the column select signal Y.

The row select signal X turns to "1" and the column select signal Y turns to "0", when the address matching detector 107 checks whether an address of the external row address signal corresponds to an address of the defective row of the memory cell block 100-*n* or not. Therefore, since the OR signal X+Y based on the row select signal X and the column select signal Y turns to "1", the NMOS transistor N0 is turned ON, the NMOS transistor N1 is turned OFF and the PMOS transistor P0 is turned OFF. Also, in this case, the row redundancy enable fuse EX is disconnected and the column redundancy enable fuse EY is connected. Therefore, the electrical potential of the nodes NA and NB are substantially kept on the power supply potential VDD through the PMOS transistor P1. As the result, the level of the output signal from the inverter INV2, that is, the level of the state signal B turns to "1". This state signal B represents the execution of the substitution of the redundant row of the row redundant memory cell array 101-*n* for the defective row of the memory cell block 100-*n*.

The column select signal Y turns to "1" and the row select signal X turns to "0", when the address matching detector 107 checks whether an address of the external column address signal corresponds to an address of the defective column of the memory cell block 100-*n* or not. Therefore, since the OR signal X+Y based on the row select signal X and the column select signal Y turns to "1", the NMOS transistor N0 is turned OFF, the NMOS transistor N1 is turned ON and the PMOS transistor P0 is turned OFF. Also, in this case, the row redundancy enable fuse EX is connected and the column redundancy enable fuse EY is disconnected. Therefore, the electrical potential of the nodes NA and NB are substantially kept on the power supply potential VDD through the PMOS transistor P1. As the result, the level of the output signal from the inverter INV2, that is, the level of the state signal B turns to "1". This state signal B represents the execution of the substitution of a redundant column in the column redundant memory cell array 102 for the defective column of the memory, cell block 100-*n*.

On the other hand, when the redundant row and the redundant column are not selected, the fuses EX and EY are connected. In this case, since either the level of the row select signal X or the level of the column select signal Y turns to "1", either the NMOS transistor N0 or the NMOS transistor N1 is turned ON. Therefore, the electrical potential of the nodes NA and NB are substantially kept on the ground potential VSS. As the result, the level of the output signal from the inverter INV2, that is, the level of the state signal B turns to "0". This state signal B represents the inexecution of the substitution of a redundant column in the column redundant memory cell array 102 for the defective column of the memory cell block 100-*n*.

Figure 5:
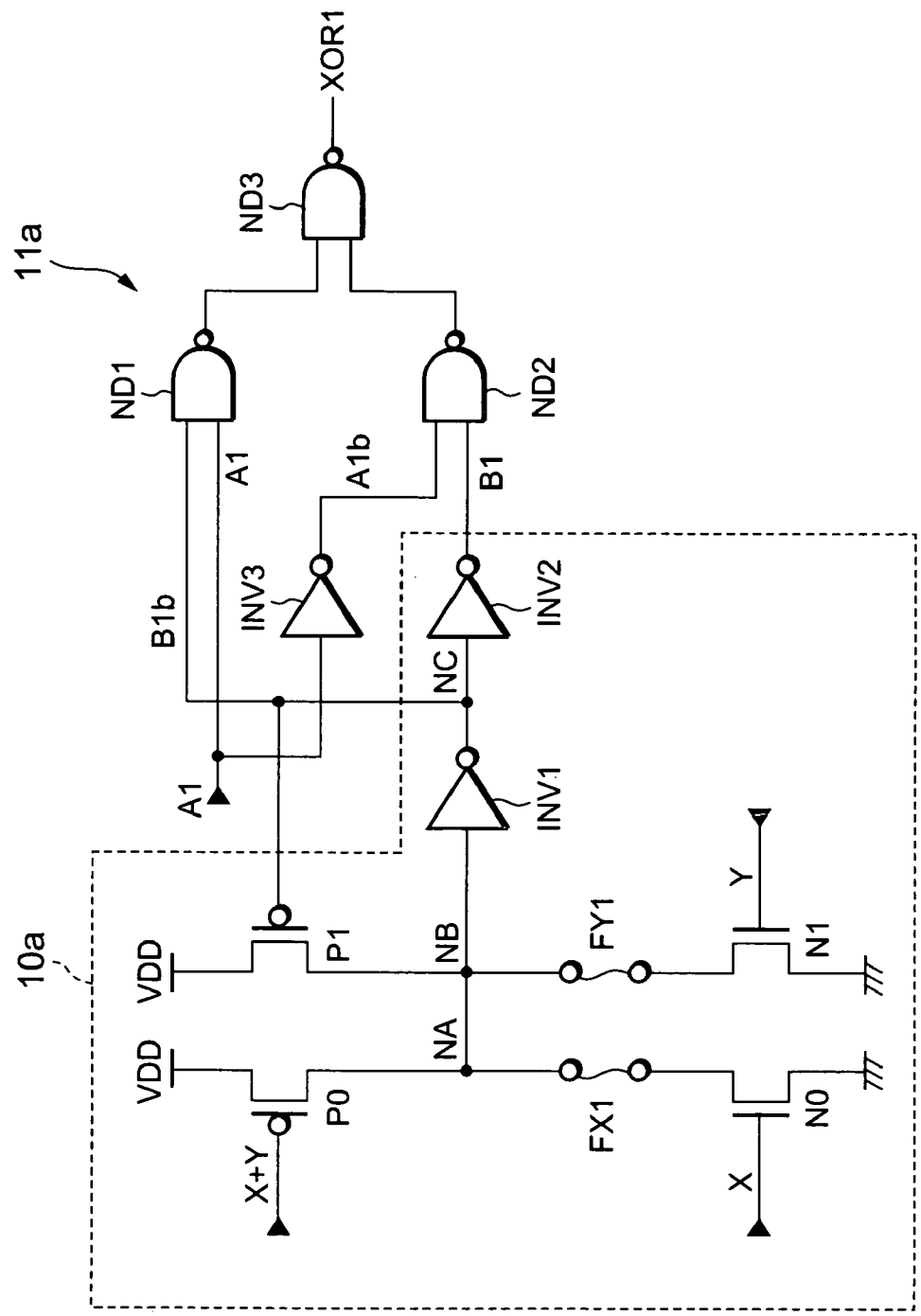
FIG. 5 is a circuit layout showing a detailed configuration of the selecting circuit 10a and the exclusive OR circuit 11a in the address matching detector 107 shown in FIG. 3.

FIG. 5 is a circuit layout showing a detailed configuration of the selecting circuit 10*a* and the exclusive OR circuit 11*a* in the address matching detector 107 shown in FIG. 3. The selecting circuits 10*b*–10*g* are the same configurations as the selecting circuit 10*a* and the exclusive OR circuits 11*b*–11*i* are the same configurations as the exclusive OR circuit 11*a*. Therefore, the selecting circuit 10*a* and the exclusive OR circuit 11*a* are explained below on behalf of the selecting circuits 10*a*–10*g* and the exclusive OR circuits 11*a*–11*i*. The selecting circuit 10*a* has a configuration similar to the selecting circuit 9. In the selecting circuit 10*a*, the row address storing fuse FX1 is connected between the node NA and the ground potential VSS instead of the row redundancy enable fuses EX in the selecting circuit 9, and the column address storing fuse FY1 is connected between the node NB and the ground potential VSS instead of the column redundancy enable fuse EY in the selecting circuit 9.

The operation of the selecting circuit 10*a* is described below. In the standby mode of the address matching detector 107, both the row select signal X and the column select signal Y are non-active, that is, the both signals indicate "0". In this case, since the OR signal X+Y based on the row select signal X and the column select signal Y turns to "0", the PMOS transistor P0 is turned ON and the NMOS transistor N1 is turned OFF. Therefore, the nodes NA and NB are charged with the power supply voltage by the power supply potential VDD.

When the address matching detector 107 checks whether an address of the external row address signal corresponds to an address of the defective row of the memory cell block 100-*n* or not, the row select signal X turns to "1" and the column select signal Y turns to "0". Therefore, since the OR signal X+Y based on the row select signal X and the column select signal Y turns to "1", the NMOS transistor N0 is turned ON, the NMOS transistor N1 is turned OFF and the PMOS transistor P0 is turned OFF. Hence, the column address storing fuse FY1 is invalid, and the connection state of the row address storing fuse FX1 is referred in the selecting circuit 10*a*. In this instance, when the fuse FX1 is disconnected, the electrical potential of the nodes NA and NB are substantially kept on the power supply potential VDD through the PMOS transistor P1. That is, the level of the state signal B1 turns to "1". On the other hand, when the fuse FX1 is connected, the electrical potential of the nodes NA and NB are substantially kept on the ground potential VSS through the NMOS transistor N1. Hence, the level of the output signal from the inverter INV1 turns to "1" and the PMOS transistor P1 is turned OFF. As the result, the electrical potential of the nodes NA and NB turn to "0", that is, the level of the state signal B1 turns to "0".

When the address matching detector 107 checks whether an address of the external column address signal corresponds to an address of the defective column of the memory cell block 100-*n* or not, the row select signal X turns to "0" and the column select signal Y turns to "1". Therefore, since the OR signal X+Y based on the row select signal X and the column select signal Y turns to "1", the NMOS transistor N0 is turned OFF, the NMOS transistor N1 is turned ON and the PMOS transistor P0 is turned OFF. Hence, the row address storing fuse FX1 is invalid and the connection state of the column address storing fuse FY1 is referred in the selecting circuit 10*a*. In this instance, when the fuse FY1 is disconnected, the electrical potential of the node NA or NB is kept substantially on the power supply potential VDD through the PMOS transistor P1. That is, the level of the state signal B1 turns to "1". On the other hand, when the fuse FY1 is connected, the electrical potential of the nodes NA and NB are substantially kept on the ground potential VSS through the NMOS transistor N1. Hence, the level of the output signal from the inverter INV1 turns to "1" and the PMOS transistor P1 is turned OFF. As the result, the electrical potential of the nodes NA and NB turn to "0", that is, the level of the state signal B1 turns to "0".

As mentioned above, the selecting circuit 10*a* outputs the state signal B1 which represents the connection state with respect to either the fuse FX1 or the fuse FY1 according to checking either the external column address signal or the external row address signal. When both the fuse FX1 and the fuse FY1 are connected, the level of the state signal B1 turns to "0". When both the fuse FX1 and the fuse FY1 are disconnected, the level of the state signal B1 turns to "0".

The exclusive OR circuit 11*a* comprises three NAND circuits ND1–ND3 and an inverter INV3. The bit A1 of the external address signal A and the inverted state signal B1*b* are input to the NAND circuit ND1. The state signal B1 output from the selecting circuit 10*a* and an inverted bit A1*b* output from the inverter INV3 are input to the NAND circuit ND2. The output signals from the NAND circuits ND1 and ND2 are input to the NAND circuit ND3. The NAND circuit ND3 outputs an exclusive OR signal XOR1 generated based on the inverted bit A1*b* and the state signal B1 to the second logic circuit 12. In concrete terms, the exclusive OR signal XOR1 turns to "0" when the inverted bit A1*b* corresponds to the state signal B1 and turns to "1" when the inverted bit A1*b* does not correspond to the state signal B1. Also, in the standby mode of the address matching detector 107, as well as in the selecting circuit 10*a*, the nodes NA and NB are charged with the power supply voltage by the power supply potential VDD.

Figure 6:
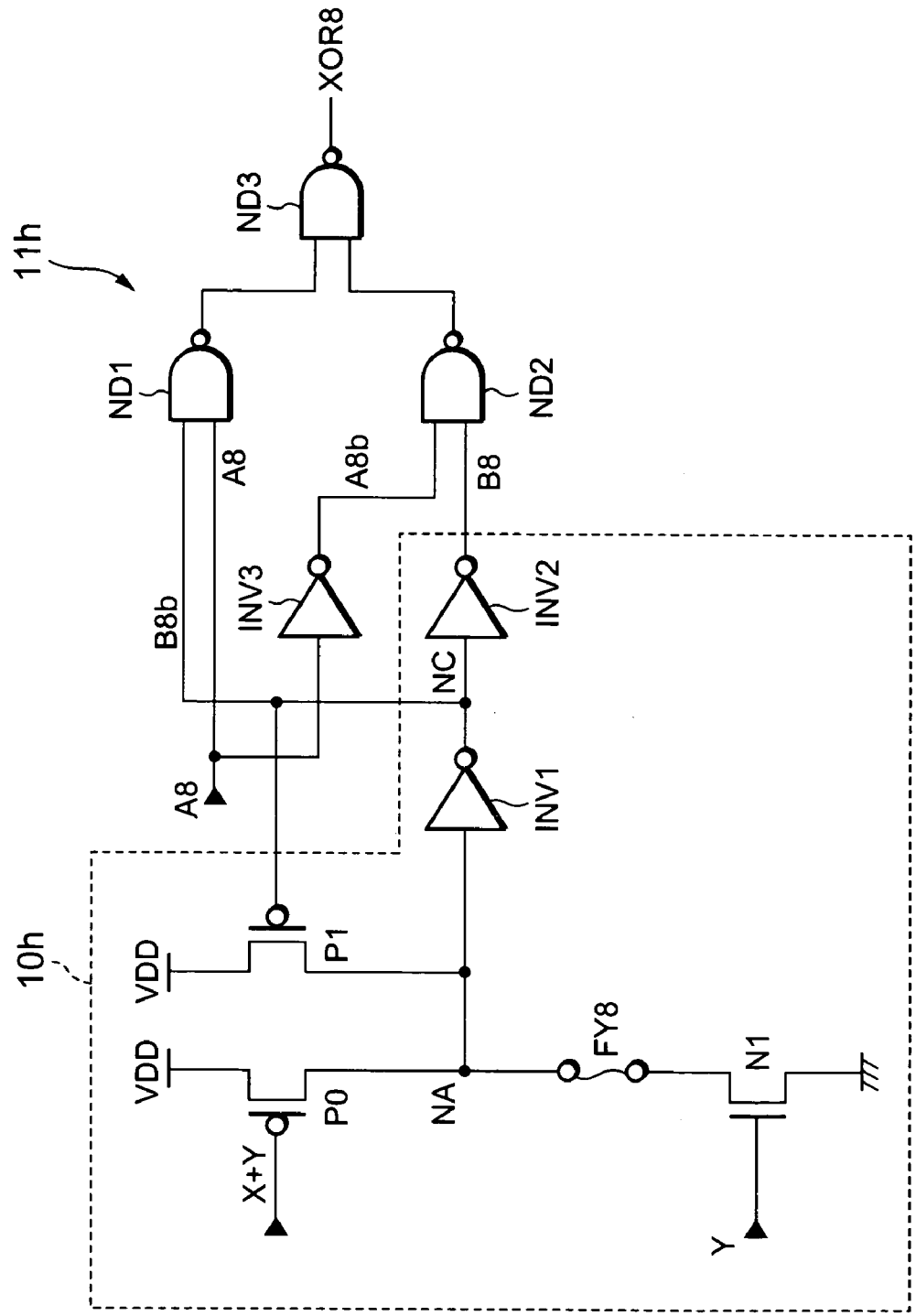
FIG. 6 is a circuit layout showing a detailed configuration of the selecting circuit 10h in the address matching detector 107 shown in FIG. 3.

FIG. 6 is a circuit layout showing a detailed configuration of the selecting circuit 10*h* in the address matching detector 107 shown in FIG. 3. The selecting circuit 10*i* has the same configuration as the selecting circuit 10*h*. The selecting circuit 10*h* comprises PMOS transistors P0 and P1, an NMOS transistor N1 and inverters INV1 and INV2. The PMOS transistor P0 is connected between the power supply potential VDD and a node NA. The PMOS transistor P1 is connected between the power supply potential VDD and a node NB. The column address storing fuse FY8 and the NMOS transistor N1 are connected in series between the node NA and the ground potential VSS. The selecting circuit 10*h* does not have a row address storing fuse. The conduction states in the PMOS transistor P0 and the NMOS transistor N1 are controlled by the column select signal Y input to the gate electrode of the NMOS transistor N1. The other configurations of the selecting circuit 10*h* are the same as those of the selecting circuit 10*a*.

The operation of the selecting circuit 10*h* is described below. In the standby mode of the address matching detector 107, both the row select signal X and the column select signal Y are non-active. In this case, since the OR signal X+Y based on the row select signal X and the column select signal Y turns to "0", the PMOS transistor P0 is turned ON and the NMOS transistor N1 is turned OFF. Therefore, similar to the operation in the selecting circuit 10*a*–10*g*, the nodes NA and NB are charged with the power supply voltage by the power supply potential VDD.

When the column select signal Y turns to "0", that is, when the address matching detector 107 checks whether an address of the external row address signal corresponds to an address of the defective row of the memory cell array 100-*n* or not, the PMOS transistor P0 is turned ON and the NMOS transistor N1 is turned OFF. In this instance, the nodes NA and NB are charged with the power supply voltage by the power supply potential VDD. Therefore, the level of the output signal from the inverter INV1 turns to "0" and the PMOS transistor P1 is turned ON. As the result, the output signal from the inverter INV2, that is, the state signal B8 turns to "1".

When the column select signal Y turns to "1", that is, when the address matching detector 107 checks whether an address of the external column address signal corresponds to an address of the defective column of the memory cell array 100-*n* or not, the PMOS transistor P0 is turned OFF and the NMOS transistor N1 is turned ON. In this instance, when the fuse FY8 is disconnected, the electrical potentials of the nodes NA and NB are substantially kept on the power supply potential VDD by the power supply voltage charged in the standby mode. As the result, the level of the state signal B8 turns to "1". On the other hand, when the fuse FY8 is connected, the electrical potential of the nodes NA and NB are substantially kept on the ground potential VSS through the NMOS transistor N1. Hence, the level of the output signal from the inverter INV1 turns to "1" and the PMOS transistor P1 is turned OFF. As the result, the electrical potential of the nodes NA and NB turn to "0", that is, the level of the state signal B8 turns to "0".

As shown in FIG. 6, the exclusive OR circuit 11*h* comprises three NAND circuits ND1–ND3 and an inverter INV3 as the above mentioned exclusive OR circuit 11*a*–11*g* does. The bit A8 of the external address signal A and the inverted state signal B8*b* are input to the NAND circuit ND1. The state signal B8 output from the selecting circuit 10*h* and an inverted bit A8*b* output from the inverter INV3 are input to the NAND circuit ND2. The output signals from the NAND circuits ND1 and ND2 are input to the NAND circuit ND3. The NAND circuit ND3 outputs an exclusive OR signal XOR8 generated based on the inverted bit A8*b* and the state signal B8 to the second logic circuit 12.

First, in the standby mode of the address matching detector 107, as well as in the selecting circuits 10*a*–10*g* and the exclusive OR circuits 11*a*–11*g*, the nodes NA and NB are charged with the power supply voltage by the power supply potential VDD.

When the address matching detector 107 checks whether an address of the external row address signal corresponds to an address of the defective row of the memory cell block 100-*n* or not, as described above, the state signal B8 output from the selecting circuit 10*h* turns to "1". Also, in this instance, the level of the bit A8 of the external row address signal is set to "1". Therefore, each of the output signals from the NAND circuits ND1 and ND2 turns to "1". It follows that the output signal from the NAND circuit ND3 turns to "0". That is, the output signals from the exclusive OR circuits 10*h* and 10*i* turns to "0" when the address matching detector 107 checks the correspondence between the address of the external row address signal and the address of the defective row of the memory cell block 100-*n*.

When the address matching detector 107 checks whether an address of the external column address signal corresponds to an address of the defective column of the memory cell block 100-*n* or not, as described above, the state signal B8 output from the selecting circuit 10*h* turns to "1" if the column address storing fuse FY8 is disconnected and turns to "0" if the fuse FY8 is connected. And, the output signals from the exclusive OR circuits 10*h* and 10*i* turns to "0" when the bit A8 corresponds to the state signal B8 and turns to "1" when the bit A8 does not correspond to the state signal B8.

The operation of the address matching detector 107 is described below. When the address matching detector 107 checks whether the address of the external row address signal corresponds to the address of the defective row of the memory cell block 100-*n* or not, the row select signal X turns to "1" and the column select signal Y turns to "0". In this instance, the connection states of the row address storing fuses FX1–FX7 are respectively referred in the selecting circuits 10*a*–10*g* and are respectively transferred as the state signals B1–B7 to the exclusive OR circuits 11*a*–11*g* of the first logic circuit 11. That is, the state signals B8 and B9 which turn to "1" are transferred to the exclusive OR circuits 11*h* and 11*i* of the first logic circuit 11. And also, the bits A8 and A9 of the external row address signal A which are set to "1" are input to the exclusive OR circuits 11*h* and 11*i*.

As shown in FIGS. 5 and 6, the bits A1–A9 of the external row address signal A is respectively compared with the state signals B1–B9 in the exclusive OR circuits 11*a*–11*i*. In this embodiment, when the row select signal X turns to "1" and the column select signal Y turns to "0", the state signals B8 and B9 turn to "1", and also, the bits A8–A9 are set to "1". Therefore, the output exclusive OR signals XOR1–XOR9 inevitably turn to "0". Hence, when the bits A1–A7 of the external row address signal A correspond to the state signals B1–B7, the output exclusive OR signals XOR1–XOR7 turn to "0". Conversely, when the bit signals A1–A7 don't correspond to the state signals B1–B7, the output signals XOR1–XOR7 turn to "1". The second logic circuit 12 outputs the OR signal ADDXOR based on the state signal B generated by the row redundancy enable fuse EX and the output exclusive OR signals XOR1–XOR9.

When the state signal B turns to "1" (which represents the execution of the substitution of the redundant row for the defective row) and all of the exclusive OR signals XOR1–XOR9 turn to "0" (which represents the correspondence between the address of the external row address signal and the address of the defective row), the OR signal ADDXOR output from the second logic circuit 12 turns to "0". In this instance, the redundant row of the row redundant memory cell array 101-*n* is selected instead of the defective row of the memory cell block 100-*n* by the external row address signal A.

On the other hand, when the state signal B turns to "0" (which represents the inexecution of the substitution of the redundant row for the defective row) and at least one of the exclusive OR signals XOR1–XOR9 turn to "1" (which represents the inconsistency between the address of the external row address signal and the address of the defective row), the OR signal ADDXOR output from the second logic circuit 12 turns to "1". In this instance, the redundant row of the row redundant memory cell array 101-*n* is not selected.

When the address matching detector 107 checks whether an address of the external column address signal corresponds to an address of the defective column of the memory cells block 100-*n* or not, the row address signal X turns to "0" and the column address signal Y turns to "1". In this instance, the connection state of the column address storing fuses FY1–FY9 are respectively referred in the selecting circuits 10*a*–10*i* and are respectively transferred as the state signals B1–B9 to the exclusive OR circuits 11*a*–11*i*. As shown in FIG. 5, bits A1–A9 of the external column address signal A is respectively compared with the state signals B1–B9 in the exclusive OR circuits 11*a*–11*g*. The output exclusive OR signals XOR1–XOR9 turn to "0" when the bits A1–A9 of the external column address signal A correspond to the state signals B1–B9. Also, the output signals XOR1–XOR9 turn to "1" when the bits A1–A9 don't correspond to the state signals B1–B9. The second logic circuit 12 outputs the OR signal ADDXOR based on the state signal B generated by the column redundancy enable fuse EY and the output exclusive OR signals XOR1–XOR9.

When the state signal B turns to "1" (which represents the execution of the substitution of the redundant column for the defective column) and all of the exclusive OR signals XOR1–XOR9 turn to "0" (which represents the correspondence between the address of the external column address signal and the address of the defective column), the OR signal ADDXOR output from the second logic circuit 12 turns to "0". In this instance, the redundant column of the column redundant memory cell array 102 is selected instead of the defective column of the memory cell block 100-*n* by the external column address signal A.

On the other hand, when the state signal B turns to "0" (which represents the inexecution of the substitution of between the redundant column for the defective column) and at least one of the exclusive OR signals XOR1–XOR9 turn to "1" (which represents the inconsistency between the address of the external column address signal and the address of the defective column), the OR signal ADDXOR output from the second logic circuit 12 turns to "1". In this instance, the redundant column of the column redundant memory cell array 102 is not selected.

According to the first preferred embodiment, an address matching detector is connected with both the row fuse block for the row redundancy and the column fuse block for the column redundancy. That is, since the selecting circuit has both the row address storing fuse and the column address storing fuse so as to output the state signal which represents the connection state with respect to either the row address storing fuse or the column address storing fuse, the address matching detector can compare the state signal with the external row address signal and the external column address signal. Therefore, the address matching detector can check the correspondence or the inconsistency both between the address of the external row address signal and the address of the defective row and between the address of the external column address signal and the address of the defective column. It follows that the total area of the address matching detector in the present invention can be reduced to be about half as much as the total area of the address matching detectors separately formed for each of the row fuse block and the column fuse block. As the result, the semiconductor memory device including the above address matching detectors can be miniaturized.

Also, since the address signal lines are shared between the external row address signal and the external column address signal, the area on which the address signal lines are disposed can be reduced. Furthermore, if the address matching detector are disposed under the address signal lines, the semiconductor memory device can be more miniaturized.

Second Preferred Embodiment

Figure 7:
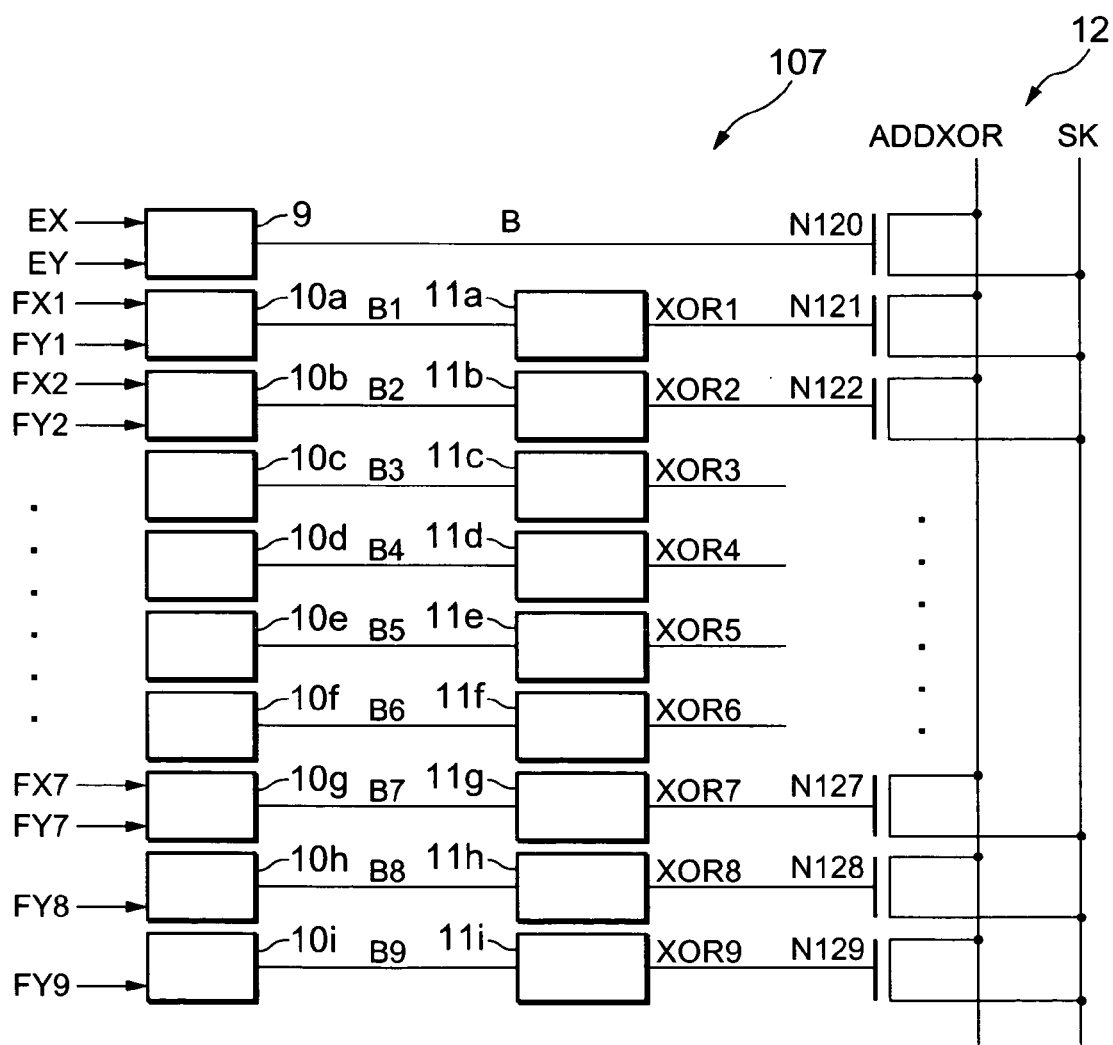
FIG. 7 is a block diagram of the address matching detector 107 according to a second preferred embodiment.

FIG. 7 is a diagram of the address matching detector 107 according to a second preferred embodiment of the present invention. The configuration of the second logic circuit 12 in the address matching detector 107 according to the second preferred embodiment is different from that according to the first preferred embodiment. The other configurations of the address matching detector 107 according to the second preferred embodiment are the same as those according to the first preferred embodiment. That is, the second logic circuit 12 has a plurality of NMOS transistors N120–N129 whose drain electrodes are connected with a first common signal line ADDXOR and whose source electrodes are connected with a second common signal line SK, instead of the NAND circuits ND1–ND3 which execute the two-step logical operation. These NMOS transistors N120–N129 are connected in series one another. The state signal B output from the selecting circuit 9 is input to the gate electrode of the NMOS transistor N120. The exclusive OR signals XOR1–XOR9 output from the exclusive OR circuits 11a–11i are respectively input to the gate electrodes of the NMOS transistors N121–N129. Besides, the state signal B turns to "0" when the substitution of the redundant row is executed for the defective row or the substitution of the redundant column for the defective column is executed, and the state signal B turns to "1" when the above mentioned substitution is not executed.

The electrical potentials of the first common signal line ADDXOR and the second common signal line SK are charged with "1" by the power supply potential VDD in the standby mode of the address matching detector 107. The second common signal SK is turned "0" when the address of the external address signal is compared with the address of the defective row or the defective column in the memory cell block 100-n. All of the exclusive OR signals XOR1–XOR9 turn to "0" as well as in the first preferred embodiment, when the address of the external address signal corresponds to the address of the defective row or the defective column. Furthermore, in this instance, when the state signal B turns to "0" (which represents the execution of the substitution), all of the conduction states of the NMOS transistors N120–N129 are turned OFF. Therefore, the electrical potential of the first common signal line ADDXOR is kept "1". As the result, the redundant row is selected instead of the defective row or the redundant column is selected instead of the defective column. In the meantime, when the state signal B turns to "1" (which represents the inexecution of the substitution) or at least one of the exclusice OR signals XOR1–XOR9 turns to "1", at least one of the NMOS transistors N120–N129 is turned ON. Therefore, the electrical potential of the first common signal line ADDXOR turns to "0". As the result, neither the redundant row nor the redundant column is selected.

According to the second preferred embodiment, since the second logic circuit comprises a plurality of the NMOS transistors connected in series one another, the one-step logical operation can be realized in the second logic circuit. Therefore, the speed of response in the address matching detector can be improved.

Furthermore, in the test mode of the address matching detector, the second common signal line is kept "1" in order to select the redundant row or the redundant column, on the other hand, the first common signal line is kept "0" in order not to select the redundant row or the redundant column. Therefore, the address matching detector can be simply comprised without adding new elements in order to realize the case that the redundant row or the redundant column is selected in the test mode and the opposite case.

Third Preferred Embodiment

Figure 8:
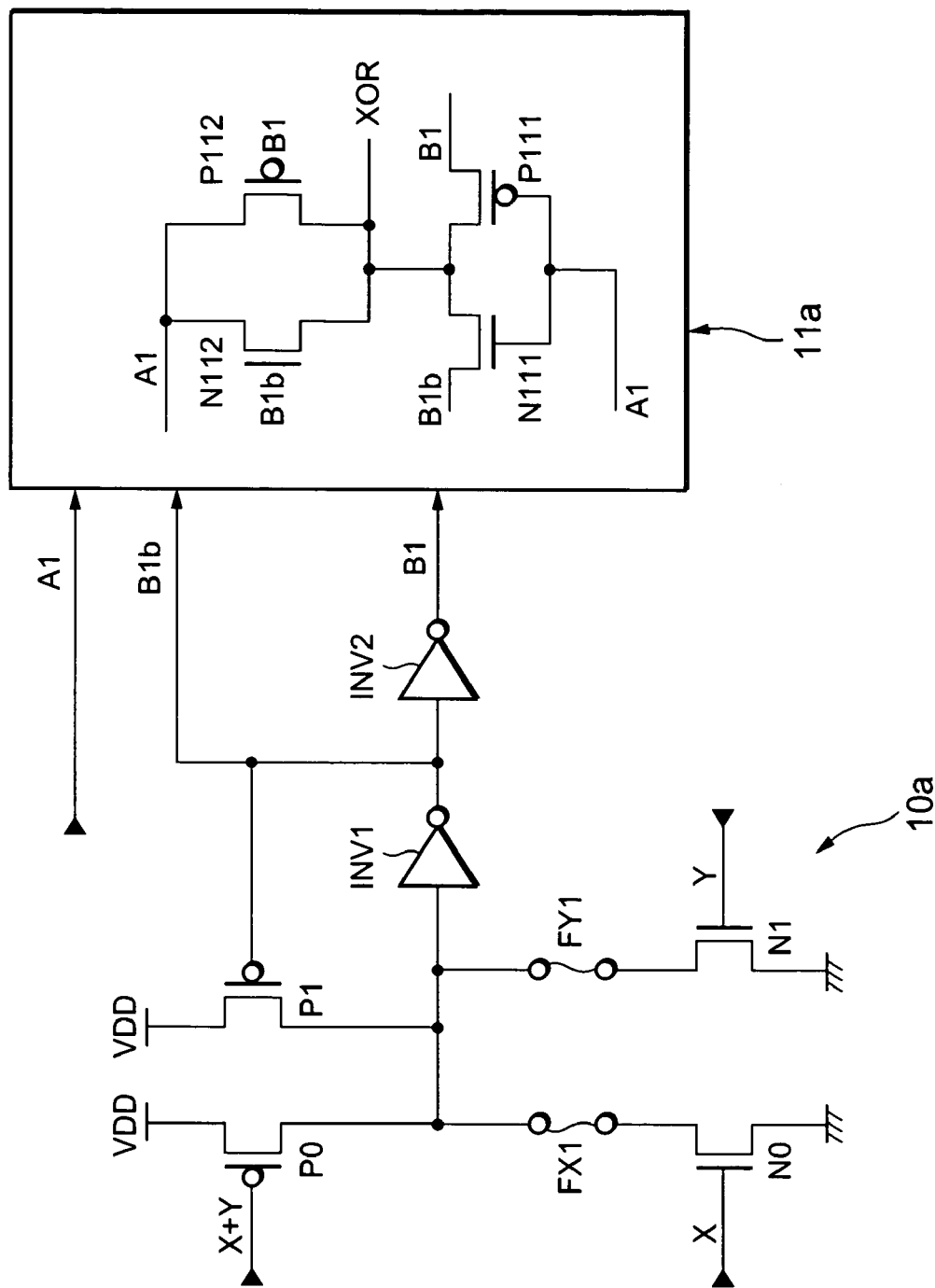
FIG. 8 is a circuit layout showing a detailed configuration of the selecting circuit 10a and the exclusive OR circuit 11a according to a third preferred embodiment.

FIG. 8 is a circuit layout showing a detailed configuration of the selecting circuit 10a and the exclusive OR circuit 11a according to a third preferred embodiment of the present invention. The configurations of the exclusive OR circuits 11b–11i are the same as that of the exclusive OR circuit 11a. In the address matching detector 107 according to the third preferred embodiment, the configurations of the exclusive OR circuit 11a–11i are different from those of the first or second preferred embodiment.

The exclusive OR circuit 11a comprises a first NMOS transistor N111 and a first PMOS transistor P111 connected in series each other and a second NMOS transistor N112 and a second PMOS transistor P112 connected in series each other. The gate electrode of the first NMOS transistor N111 receives the bit A1 of the external address signal A and the source electrode of it receives the inverted state signal B1b output from the selecting circuit 10a. The gate electrode of the first PMOS transistor P111 receives the bit A1 of the external address signal A and the source electrode of it receives the state signal B1 output from the selecting circuit 10a. The gate electrode of the second NMOS transistor N112 receives the inverted state signal B1b output from the selecting circuit 10a and the source electrode of it receives the bit A1 of the external address signal A. The gate electrode of the second PMOS transistor P112 receives the state signal B1 output from the selecting circuit 10a and the source electrode of it receives the bit A1 of the external address signal A. The drain electrodes of the first and second NMOS transistors N111 and N112 and the first and second PMOS transistors P111 and P112 are connected to the output node Nout of the exclusive OR circuit 11a.

First, the case that the bit A1 of the external address signal A corresponds to the state signal B1 in this exclusive OR circuit 11a is described below. When the bit A1 and the state signal B1 are turned "1", the first NMOS transistor N111 is turned ON and the second NMOS transistor N112 and the first and second PMOS transistors P111 and P112 are turned OFF. Therefore, the exclusive OR signal XOR1 is turned "0". When the bit A1 of the external address signal A and the state signal B1 are turned "0", the second NMOS transistor N112 is turned ON and the first NMOS transistor N111 and the first and second PMOS transistors P111 and P112 are turned OFF. Therefore, the exclusive OR signal XOR1 is turned "0".

Second, the case that the bit A1 of the external address signal A does not correspond to the state signal B1 in this exclusive OR circuit 11a is described below. When the bit A1 is turned "1" and the state signal B1 is turned "0", the second PMOS transistor P112 is turned ON and the first PMOS transistor P111 and the first and second NMOS transistors N111 and N112 are turned OFF. Therefore, the exclusive OR signal XOR1 is turned "1". When the bit A1 is turned "0" and the state signal B1 is turned "1", the first PMOS transistor P111 is turned ON and the second PMOS transistor P112 and the first and second NMOS transistors N111 and N112 are turned OFF. Therefore, the exclusive OR signal XOR1 is turned "1".

According to the third preferred embodiment, since the exclusive OR circuits are respectively comprised of the two CMOS (Complementary MOS) gates, the number of the MOS transistors of the exclusive OR circuits can be less than that in the first and second preferred embodiments. Therefore, when the design rule of the integrated circuit is large, the pitch between the adjacent fuses can be small. Also, the leakage current in the standby mode and the operation current in the operation mode can be decreased.

In addition, in the third preferred embodiment, even if the bit A1 of the external address signal A is input to the source electrode of the first PMOS transistor P111 and the gate electrode of the second PMOS transistor P112, the inverted bit A1b of the external address signal A is input to the source electrode of the second NMOS transistor N112, and the state signal B1 is input to the gate electrode of the second NMOS transistor N112 and the gate electrodes of the first PMOS transistor P111 and the first NMOS transistor N111 and the source electrodes of the second PMOS transistor P112 and the second NMOS transistor N112, the above mentioned operation and effect can be realized.

Fourth Preferred Embodiment

Figure 9:
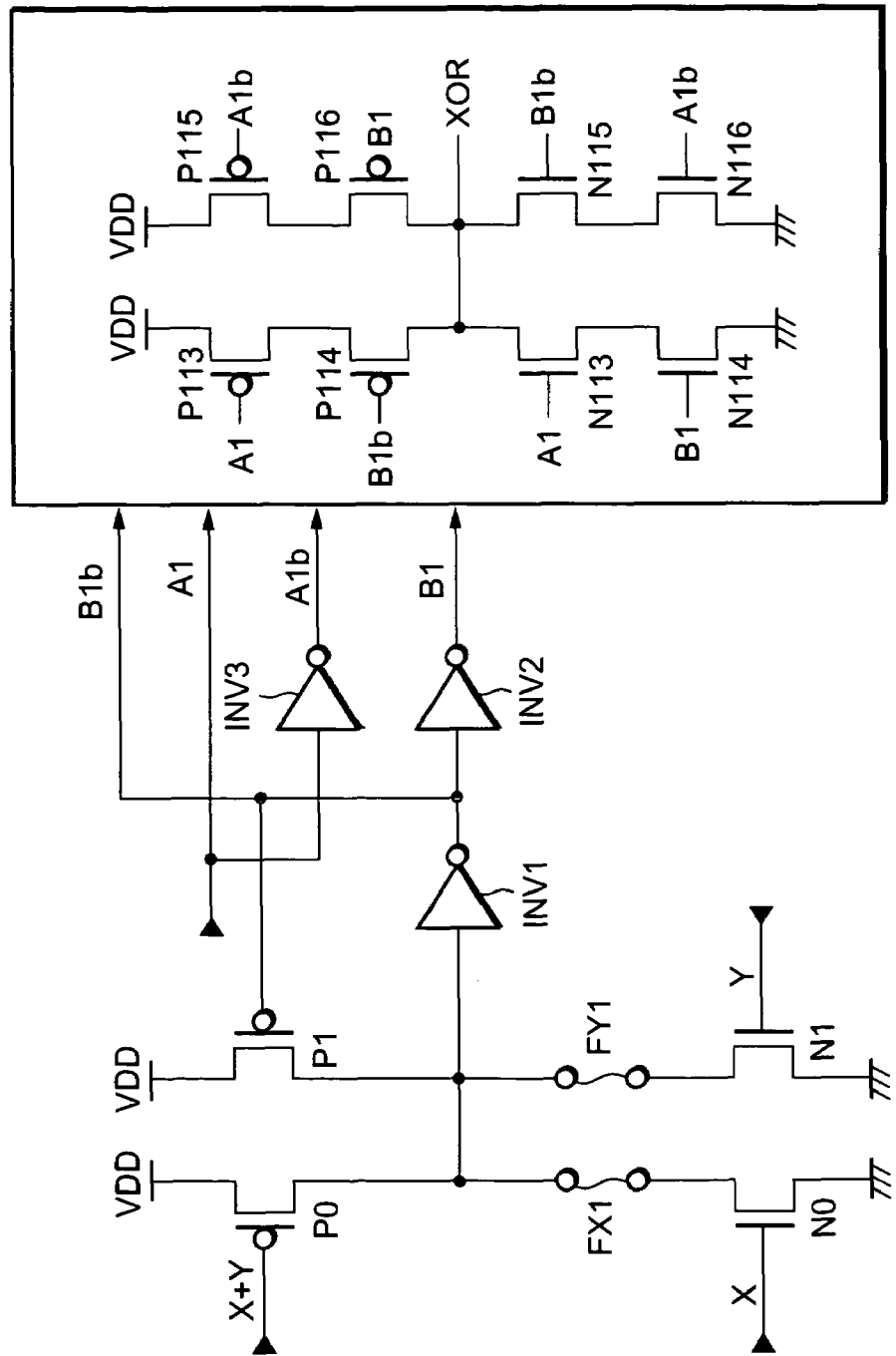
FIG. 9 is a circuit layout showing a detailed configuration of the selecting circuit 10a and the exclusive OR circuit 11a according to a fourth preferred embodiment.

FIG. 9 is a circuit layout showing a detailed configuration of the selecting circuit 10a and the exclusive OR circuit 11a according to a fourth preferred embodiment of the present invention. The configurations of the exclusive OR circuits 11b–11i are the same as that of the exclusive OR circuit 11a. In the address matching detector 107 according to the fourth preferred embodiment, the configurations of the exclusive OR circuit 11a–11i are different from those of the first or second preferred embodiment.

The exclusive OR circuit 11a in this embodiment has first to fourth NMOS transistors N113–N116 and first to fourth PMOS transistors P113–P116. Drain electrodes of the first and third NMOS transistors N113 and N115 and the second and fourth PMOS transistors P114 and P116 are connected with the output node of the exclusive OR circuit 11a. The exclusive OR signal XOR1 is output from the output node. The first and second NMOS transistors N113 and N114 are connected in series each other between the output node and the ground potential VSS. The gate electrode of the first NMOS transistor N113 receives the bit A1 of the external address signal A and the gate electrode of the second NMOS transistor N114 receives the state signal B1. The third and fourth NMOS transistors N115 and N116 are connected in series each other between the output node and the ground potential VSS. The gate electrode of the third NMOS transistor N115 receives the inverted state signal B1b. The gate electrode of the fourth NMOS transistor N116 receives the inverted bit A1b of the external address signal A. The first and second PMOS transistors P113 and P114 are connected in series each other between the power supply potential VDD and the output node. The gate electrode of the first PMOS transistor P113 receives the bit A1 of the external address signal A. The gate electrode of the second PMOS transistor P114 receives the inverted state signal B1b. The third and fourth PMOS transistors P115 and P116 are connected in series each other between the power supply potential VDD and the output node. The gate electrode of the third PMOS transistor P115 receives the bit A1 of the external address signal A. The gate electrode of the fourth PMOS transistor P116 receives the state signal B1.

First, the case that the bit A1 of the external address signal A corresponds to the state signal B1 in this exclusive OR circuit 11a is described below. When the bit A1 of the external address signal A and the state signal B1 are turned "1", the first and second NMOS transistors N113 and N114 are turned ON. Therefore, the exclusive OR signal XOR1 is turned "0". When the bit A1 of the external address signal A and the state signal B1 are turned "0", the third and fourth NMOS transistors N115 and N116 are turned ON. Therefore, the exclusive OR signal XOR1 is turned "0".

Second, the case that the bit A1 of the external address signal A does not correspond to the state signal B1 in this exclusive OR circuit 11a is described below. When the bit A1 of the external address signal A is turned "1" and the state signal B1 is turned "0", the third and fourth PMOS transistors P115 and P116 are turned ON. Therefore, the exclusive OR signal XOR1 is turned "1". When the bit A1 of the external address signal A is turned "0" and the state signal B1 is turned "1", the first and second PMOS transistors P113 and P114 are turned ON. Therefore, the exclusive OR signal XOR1 is turned "1".

According to the fourth preferred embodiment, since the exclusive OR circuits are respectively comprised of four NMOS transistors and four PMOS transistors, the number of the MOS transistors of the exclusive OR circuits can be less than that in the first and second preferred embodiments. Therefore, when,the design rule of the integrated circuit is large, the pitch between the adjacent fuses can be small. Also, the leakage current in the standby mode and the operation current in the operation mode can be decreased.

Fifth Preferred Embodiment

Figure 10:
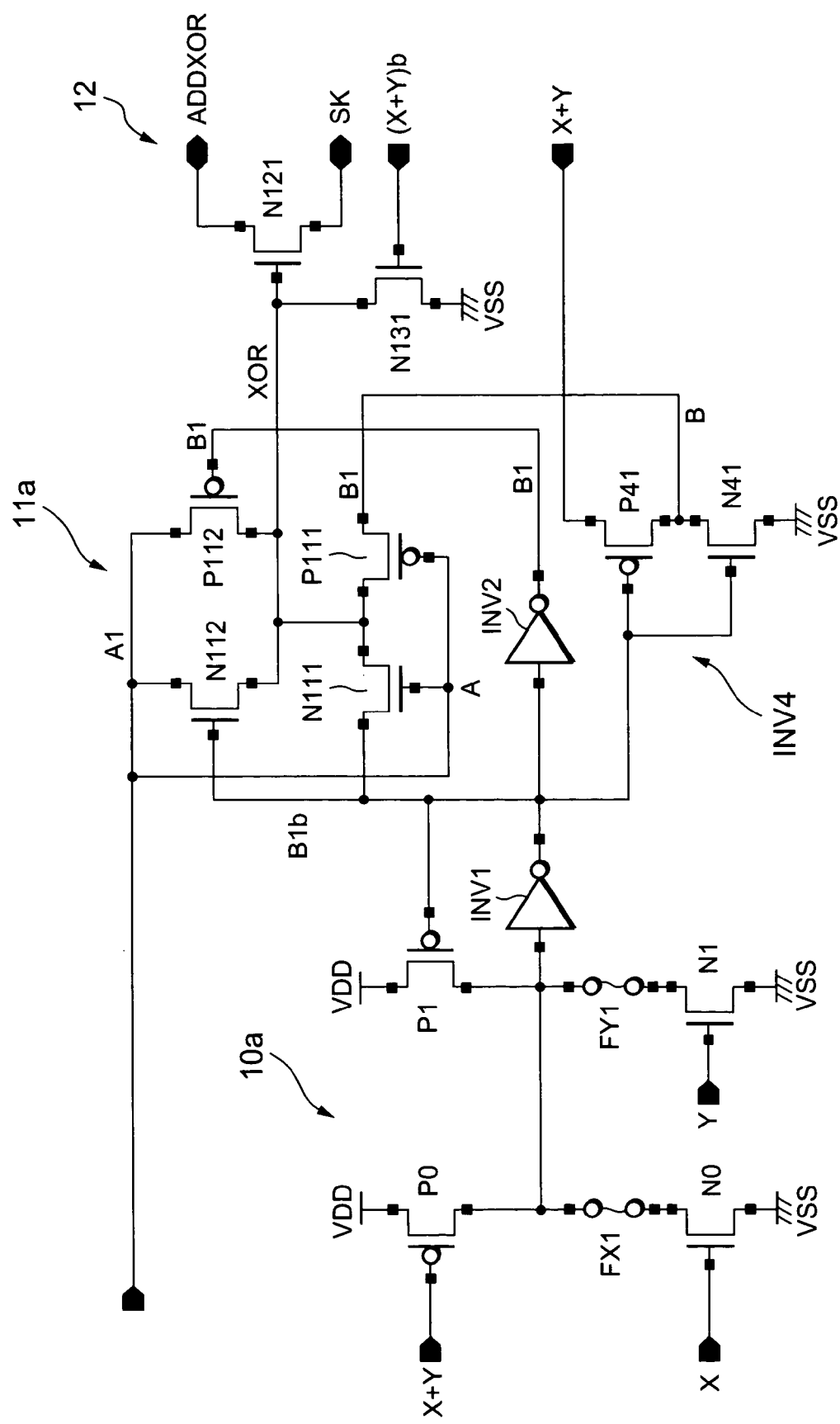
FIG. 10 is a circuit layout showing a detailed configuration of the address matching detector 107 according to a fifth preferred embodiment.

FIG. 10 is a circuit layout showing a detailed configuration of the address matching detector 107 according to a fifth preferred embodiment of the present invention. The address matching detector 107 in this embodiment comprises the selecting circuits 9 and 10a–10i according to the first preferred embodiment, the exclusive OR circuits 11a–11i according to the third preferred embodiment and the NMOS transistors N120–N129 according to the second preferred embodiment. Furthermore, the address matching detector 107 has an inverter INV4 and an NMOS transistor N131. FIG. 10 shows the selecting circuit 10a, the exclusive OR circuit 11a, the NMOS transistor N121 connected between the first common signal line ADDXOR and the second common signal line SK, the inverter INV4 and the NMOS transistor N131.

The inverter INV4 comprises a PMOS transistor P41 and an NMOS transistor N41 connected in series each other. The source electrode of the PMOS transistor P41 receives the OR signal X+Y based on the row select signal X and the column select signal Y. The conduction states of the PMOS transistor P41 and the NMOS transistor N41 are controlled by the inverted state signal B1b. The inverter INV4 outputs the state signal B1 to the exclusive OR circuit 11a as well as the inverter INV2 does. Though the inverter INV2 outputs the state signal B1 to both the PMOS transistor P111 and the PMOS transistor P112 in the third preferred embodiment, the inverter INV4 outputs the state signal B1 to one of the two PMOS transistors of the exclusive OR circuit 11a in the fifth preferred embodiment. Therefore, the driving power of the selecting circuit 10a can be improved. Also, when the external address signal is compared with the connection states of the row address storing fuses or the column address storing fuses, either the row select signal X or the column select signal Y is turned "1". Therefore, the OR signal X+Y is turned "1" and the inverter INV4 turns to operative. On the other hand, in the standby mode of the address matching detector 107, since both the row select signal X and the column select signal Y are turned "0", the OR signal X+Y is turned "0" and the inverter INV4 turns to outage. As the result, the pass current through the PMOS transistor P41 and the NMOS transistor N41 can be decreased in the standby mode of the address matching detector 107. That is, the electrical power consumption of the address matching detector in the standby mode can be decreased.

Also, as shown in FIG. 10, the gate electrode of the NMOS transistor N131 receives an inverted OR signal (X+Y)b. When the external address signal is compared with the connection states of the row address storing fuses or the column address storing fuses, either the row select signal X or the column select signal Y is turned "1". Therefore, the inverted OR signal (X+Y)b is turned "0", and the NMOS transistor N131 is turned OFF. In this instance, the exclusive OR signal XOR1 output from the exclusive OR circuit 11a is transferred to the gate electrode of the NMOS transistor N121 as it is. Conversely, in the standby mode of the address matching detector 107, since both the row select signal X and the column select signal Y are turned "0", the inverted OR signal (X+Y)b is turned "1" and the NMOS transistor N131 is turned ON. Therefore, the electrical potential of the exclusive OR signal XOR1 can be stabilized on the ground potential VSS. As the result, the electrical power consumption of the NMOS transistor N131 can be decreased even if the electrical potential of the exclusive OR signal XOR1 turns to unstable in the standby mode.

What is claimed is:

1. A semiconductor memory device, comprising:
    a memory cell block having a plurality of memory cells arranged in a plurality of rows and in a plurality of columns, wherein one of the rows is selected by a row address signal, and wherein one of the columns is selected by a column address signal;
    a redundant memory cell array having a plurality of redundant memory cells arranged in a plurality of redundant rows and in a plurality of redundant columns;
    a first fuse block having a plurality of first fuses, the first fuses corresponding to an address of the row address signal, wherein the first fuse block stores an address of a defective row of the memory cell block;
    a second fuse block having a plurality of second fuses, the second fuses corresponding to an address of the column address signal, wherein the second fuse block stores an address of a defective column of the memory cell block; and
    an address matching detector which is connected with both the first fuses and the second fuses, wherein the address matching detector checks consistency of the address of the row address signal with the address of the defective row stored in the first fuse block.

2. The semiconductor memory device according to claim 1, wherein the address matching detector comprises:
    a plurality of selecting circuits, each of which is connected with the first fuse and the second fuse, wherein the selecting circuits output a plurality of state signals based on the address of the defective row stored in the first fuse block;
    a first logic circuit which compares the address of the row address signal with the state signals; and
    a second logic circuit which detects the consistency of the address of the row address signal with the address of the defective row.

3. The semiconductor memory device according to claim 2, wherein the selecting circuit is controlled by a row select signal and a column select signal, the row select signal and the column select signal turning to active alternatively.

4. The semiconductor memory device according to claim 2, wherein the first logic circuit has a plurality of exclusive OR circuits which output a plurality of exclusive OR signals based on the state signals and one of the row address signal and the column address signal.

5. The semiconductor memory device according to claim 4, wherein the second logic circuit has an OR circuit which output an OR signal based on the exclusive OR signals.

6. The semiconductor memory device according to claim 4, wherein the second logic circuit has a plurality of NMOS transistors which are connected in series and to which the exclusive OR signals are input respectively.

7. The semiconductor memory device according to claim 4, wherein the first logic circuit comprises:
    an output node outputting the exclusive OR signal;
    a first NMOS transistor having a gate electrode, a source electrode and a drain electrode, the gate electrode receiving one of the row address signal and the column address signal and the source electrode receiving an inverted signal of the state signal;
    a first PMOS transistor having a gate electrode, a source electrode and a drain electrode, the gate electrode receiving one of the row address signal and the column address signal and the source electrode receiving the state signal;
    a second NMOS transistor having a gate electrode, a source electrode and a drain electrode, the gate electrode receiving the inverted signal of the state signal and the source electrode receiving one of the row address signal and the column address signal; and
    a second PMOS transistor having a gate electrode, a source electrode and a drain electrode, the gate electrode receiving the state signal and the source electrode receiving one of the row address signal and the column address signal;
    wherein the drain electrodes of the first and second NMOS transistors and the first and second PMOS transistors are connected with the output node.

8. The semiconductor memory device according to claim 4, wherein the first logic circuit comprises:
    an output node outputting the exclusive OR signal;
    a first NMOS transistor having a gate electrode, a source electrode and a drain electrode, the gate electrode receiving the state signal and the source electrode receiving an inverted signal of one of the row address signal and the column address signal;
    a first PMOS transistor having a gate electrode, a source electrode and a drain electrode, the gate electrode receiving the state signal and the source electrode receiving one of the row address signal and the column address signal;
    a second NMOS transistor having a gate electrode, a source electrode and a drain electrode, the gate electrode receiving the inverted signal of one of the row address signal and the column address signal and the source electrode receiving the state signal; and
    a second PMOS transistor having a gate electrode, a source electrode and a drain electrode, the gate electrode receiving one of the row address signal and the column address signal and the source electrode receiving the state signal;
    wherein drain electrodes of the first and second NMOS transistors and the first and second PMOS transistors are connected with the output node.

9. The semiconductor memory device according to claim 4, wherein the first logic circuit comprises:
    an output node outputting the exclusive OR signal;
    first and second NMOS transistors connected in series between the output node and a ground potential, the first NMOS transistor being controlled by one of the row address signal and the column address signal and the second NMOS transistor being controlled by the state signal;

third and fourth NMOS transistors connected in series between the output node and the ground potential, the third NMOS transistor being controlled by an inverted signal of the state signal and the fourth NMOS transistor being controlled by an inverted signal of one of the row address signal and the column address signal;

first and second PMOS transistors connected in series between a power supply potential and the output node, the first PMOS transistor being controlled by one of the row address signal and the column address signal and the second PMOS transistor being controlled by the inverted signal of the state signal; and third and fourth PMOS transistors connected in series between the power supply potential and the output node, the third PMOS transistor being controlled by the inverted signal of one of the row address signal and the column address signal and the fourth PMOS transistor being controlled by the state signal.

10. The semiconductor memory device according to claim 7, wherein the second logic circuit has a plurality of third NMOS transistors which are connected in series and to which receive the exclusive OR signals respectively, further comprising:

an inverter which outputs a signal based on the state signal and control one of the first PMOS transistor and the second PMOS transistor; and a fourth NMOS transistor connected between a gate electrode of the third NMOS transistor and a ground potential.

11. The semiconductor memory device according to claim 1, wherein the redundant memory cell array in the redundant rows is disposed at a central region of the memory cell block.

12. The semiconductor memory device according to claim 11, wherein the redundant memory cell array in the redundant columns is disposed at an end portion of the memory cell block.

13. The semiconductor memory device according to claim 1, further comprising:

a plurality of address signal lines which transmit one of the row address signal and the column address signal, wherein the address signal lines are disposed between the first fuse block and the second fuse block.

14. The semiconductor memory device according to claim 13, wherein the address matching detector is formed under the address signal lines.

15. A semiconductor memory device, comprising:

a memory cell block having a plurality of memory cells arranged in a plurality of rows and in a plurality of columns, wherein one of the rows is selected by a row address signal, and wherein one of the columns is selected by a column address signal;

a redundant memory cell array having a plurality of redundant memory cells arranged in a plurality of redundant rows and in a plurality of redundant columns;

a first fuse block having a plurality of first fuses, the first fuses corresponding to an address of the row address signal, wherein the first fuse block stores an address of a defective row of the memory cell block;

a second fuse block having a plurality of second fuses, the second fuses corresponding to an address of the column address signal, wherein the second fuse block stores an address of a defective column of the memory cell block; and an address matching detector which is connected with both the first fuses and the second fuses, wherein the address matching detector checks consistency of the address of the column address signal with the address of the defective column stored in the second fuse block.

16. The semiconductor memory device according to claim 15, wherein the address matching detector comprises:

a plurality of selecting circuits, each of which is connected with both the first fuses and the second fuses, wherein the selecting circuits output a plurality of state signals based on the address of the defective column stored in the second fuse block;

a first logic circuit which compares the address of the column address signal with the state signals; and a second logic circuit which detects the consistency of the address of the column address signal with the address of the defective column.

17. The semiconductor memory device according to claim 16, wherein the selecting circuit is controlled by a row select signal and a column select signal, the row select signal and the column select signal turning to active alternatively.

18. The semiconductor memory device according to claim 16, wherein the first logic circuit has a plurality of exclusive OR circuits which output a plurality of exclusive OR signals based on one of the row address signal and the column address signal and the state signals.

19. The semiconductor memory device according to claim 18, wherein the second logic circuit has an OR circuit which output an OR signal based on the exclusive OR signals.

20. The semiconductor memory device according to claim 18, wherein the second logic circuit has a plurality of NMOS transistors which are connected in series and to which the exclusive OR signals are input respectively.

21. The semiconductor memory device according to claim 18, wherein the first logic circuit comprises:

an output node outputting the exclusive OR signal;

a first NMOS transistor having a gate electrode, source electrode and a drain electrode, the gate electrode receiving one of the row address signal and the column address signal and the source electrode receiving an inverted signal of the state signal;

a first PMOS transistor having a gate electrode, source electrode and a drain electrode, the gate electrode receiving one of the row address signal and the column address signal and the source electrode receiving the state signal;

a second NMOS transistor having a gate electrode, source electrode and a drain electrode, the gate electrode receiving the inverted signal of the state signal and the source electrode receiving one of the row address signal and the column address signal; and a second PMOS transistor having a gate electrode, source electrode and a drain electrode, the gate electrode receiving the state signal and the source electrode receiving one of the row address signal and the column address signal;

wherein the drain electrodes of the first and second NMOS transistors and the first and second PMOS transistors are connected with the output node.

22. The semiconductor memory device according to claim 18, wherein the first logic circuit comprises:

an output node outputting the exclusive OR signal;

a first NMOS transistor having a gate electrode, source electrode and a drain electrode, the gate electrode receiving the state signal and the source electrode receiving an inverted signal of one of the row address signal and the column address signal;

a first PMOS transistor having a gate electrode, source electrode and a drain electrode, the gate electrode receiving the state signal and the source electrode receiving one of the row address signal and the column address signal;

a second NMOS transistor which having a gate electrode, source electrode and a drain electrode, the gate electrode receiving the inverted signal of one of the row address signal and the column address signal and the source electrode receiving the state signal; and a second PMOS transistor having a gate electrode, source electrode and a drain electrode, the gate electrode receiving one of the row address signal and the column address signal and the source electrode receiving the state signal;

wherein the drain electrodes of the first and second NMOS transistors and the first and second PMOS transistors are connected with the output node.

23. The semiconductor memory device according to claim 18, wherein the first logic circuit comprises:

an output node outputting the exclusive OR signal;

first and second NMOS transistors connected in series between the output node and a ground potential, the first NMOS transistor being controlled by one of the row address signal and the column address signal and the second NMOS transistor being controlled by the state signal;

third and fourth NMOS transistors connected in series between the output node and the ground potential, the third NMOS transistor being controlled by an inverted signal of the state signal and the fourth NMOS transistor being controlled by an inverted signal of one of the row address signal and the column address signal;

first and second PMOS transistors connected in series between a power supply potential and the output node, the first PMOS transistor being controlled by one of the row address signal and the column address signal and the second PMOS transistor being controlled by the inverted signal of the state signal; and third and fourth PMOS transistors connected in series between the power supply potential and the output node, the third PMOS transistor being controlled by the inverted signal of one of the row address signal and the column address signal and the fourth PMOS transistor being controlled by the state signal.

24. The semiconductor memory device according to claim 21, wherein the second logic circuit has a plurality of third NMOS transistors which are connected in series and to which receive the exclusive OR signals respectively, further comprising:

an inverter which outputs a signal based on one of the state signal and control one of the first PMOS transistor and the second PMOS transistor; and a fourth NMOS transistor connected between a gate electrode of the third NMOS transistor and a ground potential.

25. The semiconductor memory device according to claim 15, wherein the redundant memory cell array in the redundant rows is disposed at a central region of the memory cell block.

26. The semiconductor memory device according to claim 25, wherein the redundant memory cell array in the redundant columns is disposed at an end portion of the memory cell block.

27. The semiconductor memory device according to claim 15, further comprising:

a plurality of address signal lines which transmit one of the row address signal and the column address signal, wherein the address signal lines are disposed between the first fuse block and the second fuse block.

28. The semiconductor memory device according to claim 27, wherein the address matching detector is formed under the address signal lines.

29. The semiconductor memory device according to claim 15, wherein the address matching detector checks consistency of the address of the row address signal with the address of the defective row stored in the first fuse block.

30. The semiconductor memory device according to claim 29, wherein the address matching detector comprises:

a plurality of selecting circuits, each of which is connected with both the first fuses and the second fuses, wherein the selecting circuits output a plurality state signals based on the address of the defective row stored in the first fuse block;

a first logic circuit which compares the address of the row address signal with the state signals; and a second logic circuit which detects the consistency of the address of the row address signal with the address of the defective row.

31. A semiconductor memory device, comprising:

a memory cell block having a plurality of memory cells arranged in a plurality of rows and in a plurality of columns, wherein one of the rows is selected by a row address signal and one of the columns is selected by a column address signal;

a redundant memory cell array having a plurality of redundant memory cells arranged in a plurality of redundant rows and in a plurality of redundant columns;

a row fuse block having a plurality of row address storing fuses, the row fuse block corresponding to an address of the row address signal, wherein the row fuse block stores an address of a defective row of the memory cell block, based on connection states of the row address storing fuses;

a column fuse block having a plurality of column address storing fuses, the column fuse block corresponding to an address of the column address signal, wherein the column fuse block stores an address of a defective column of the memory cell block, based on connection states of the column address storing fuses;

a plurality of selecting circuits, each of which is connected with both the row address storing fuses and the column address storing fuses, wherein the selecting circuits output a plurality of state signals which represent one of the connection states of the row address storing fuses and the column address storing fuses;

a first logic circuit connected with the selecting circuits, wherein the first logic circuit compares one of the addresses of the row address signal and the column address signal with the state signals; and a second logic circuit connected with the first logic circuit, wherein the second logic circuit detects one of consistency of the address of the row address signal with the address of the defective row and consistency of the address of the column address signal with the address of the defective column.

32. The semiconductor memory device according to claim 31, wherein the selecting circuits are controlled by a row select signal and a column select signal, the row select signal and the column select signal turning to active alternatively.

33. The semiconductor memory device according to claim 31, wherein the first logic circuit has a plurality of exclusive OR circuits which output a plurality of exclusive OR signals based on one of the row address signal and the column address signal and the state signals.

34. The semiconductor memory device according to claim 33, wherein the second logic circuit has an OR circuit which output an OR signal based on the exclusive OR signals.

35. The semiconductor memory device according to claim 33, wherein the second logic circuit has a plurality of NMOS transistors which are connected in series and to which the exclusive OR signals are input respectively.

36. The semiconductor memory device according to claim 33, wherein the first logic circuit comprises:
an output node outputting the exclusive OR signal;
a first NMOS transistor having a gate electrode, a source electrode and a drain electrode, the gate electrode receiving one of the row address signal and the column address signal and the source electrode receiving an inverted signal of the state signal;
a first PMOS transistor having a gate electrode, a source electrode and a drain electrode, the gate electrode receiving one of the row address signal and the column address signal and the source electrode receiving the state signal;
a second NMOS transistor having a gate electrode, a source electrode and a drain electrode, the gate electrode receiving the inverted signal of the state signal and the source electrode receiving one of the row address signal and the column address signal; and
a second PMOS transistor having a gate electrode, a source electrode and a drain electrode, the gate electrode receiving the state signal and the source electrode receiving one of the row address signal and the column address signal;
wherein the drain electrodes of the first and second NMOS transistors and the first and second PMOS transistors are connected with the output node.

37. The semiconductor memory device according to claim 33, wherein the first logic circuit comprises:
an output node outputting the exclusive OR signal;
a first NMOS transistor having a gate electrode, a source electrode and a drain electrode, the gate electrode receiving the state signal and the source electrode receiving an inverted signal of one of the row address signal and the column address signal;
a first PMOS transistor having a gate electrode, a source electrode and a drain electrode, the gate electrode receiving the state signal and the source electrode receiving one of the row address signal and the column address signal;
a second NMOS transistor having a gate electrode, a source electrode and a drain electrode, the gate electrode receiving the inverted signal of one of the row address signal and the column address signal and the source electrode receiving the state signal; and
a second PMOS transistor having a gate electrode, a source electrode and a drain electrode, the gate electrode receiving one of the row address signal and the column address signal and the source electrode receiving the state signal;
wherein the drain electrodes of the first and second NMOS transistors and the first and second PMOS transistors are connected with the output node.

38. The semiconductor memory device according to claim 33, wherein the first logic circuit comprises:
an output node outputting the exclusive OR signal;
first and second NMOS transistors connected in series between the output node and a ground potential, the first NMOS transistor being controlled by one of the row address signal and the column address signal and the second NMOS transistor being controlled by the state signal;
third and fourth NMOS transistors connected in series between the output node and the ground potential, the third NMOS transistor being controlled by an inverted signal of the state signal and the fourth NMOS transistor being controlled by an inverted signal of one of the row address signal and the column address signal;
first and second PMOS transistors connected in series between a power supply potential and the output node, the first PMOS transistor being controlled by one of the row address signal and the column address signal and the second PMOS transistor being controlled by the inverted signal of the state signal; and
third and fourth PMOS transistors connected in series between the power supply potential and the output node, the third PMOS transistor being controlled by the inverted signal of one of the row address signal and the column address signal and the fourth PMOS transistor being controlled by the state signal.

39. The semiconductor memory device according to claim 36, wherein the second logic circuit has a plurality of third NMOS transistors which are connected in series and to which receive the exclusive OR signals respectively, further comprising:
an inverter which outputs a signal based on the state signal and control one of the first PMOS transistor and the second PMOS transistor; and
a fourth NMOS transistor connected between a gate electrode of the third NMOS transistor and a ground potential.

40. The semiconductor memory device according to claim 31, wherein the redundant memory cell array in the redundant rows is disposed at a central region of the memory cell block.

41. The semiconductor memory device according to claim 40, wherein the redundant memory cell array in the redundant columns is disposed at an end portion of the memory cell block.

42. The semiconductor memory device according to claim 31, further comprising:
a plurality of address signal lines which transmit one of the row address signal and the column address signal, wherein the address signal lines are disposed between the first fuse block and the second fuse block.

43. The semiconductor memory device according to claim 42, wherein the selecting circuits, the first logic circuit and the second logic circuit are formed under the address signal lines.

* * * * *